United States Patent
Brown et al.

(10) Patent No.: US 10,672,859 B2
(45) Date of Patent: Jun. 2, 2020

(54) EMBEDDED MAGNETIC INDUCTOR

(71) Applicant: Intel Corporation, Santa Clara, CA (US)

(72) Inventors: Andrew J. Brown, Phoenix, AZ (US); Rahul Jain, Gilbert, AZ (US); Sheng Li, Gilbert, AZ (US); Sai Vadlamani, Chandler, AZ (US); Chong Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/020,590

(22) Filed: Jun. 27, 2018

(65) Prior Publication Data

US 2020/0006464 A1 Jan. 2, 2020

(51) Int. Cl.
*H01L 23/522* (2006.01)
*H01L 49/02* (2006.01)
(Continued)

(52) U.S. Cl.
CPC ......... *H01L 28/10* (2013.01); *H01F 17/0006* (2013.01); *H01L 23/5227* (2013.01);
(Continued)

(58) Field of Classification Search
CPC ... H01L 23/5227; H01L 23/645; H01L 24/08; H01L 28/10; H01L 2924/19042
See application file for complete search history.

(56) References Cited

U.S. PATENT DOCUMENTS

2014/0034373 A1   2/2014  Yoshikawa et al.
2016/0295699 A1*  10/2016 Kalnitsky ............... H01L 28/10
(Continued)

FOREIGN PATENT DOCUMENTS

KR   100939648 B1   2/2010
WO   2020005423      1/2020

OTHER PUBLICATIONS

"International Application Serial No. PCT/US2019/033538, International Search Report dated Sep. 11, 2019", 4 pgs.
(Continued)

*Primary Examiner* — Cuong Q Nguyen
(74) *Attorney, Agent, or Firm* — Schwegman Lundberg & Woessner, P.A.

(57) ABSTRACT

An apparatus and method of forming a magnetic inductor circuit. A substrate is provided and a first magnetic layer is formed in contact with one layer of the substrate. A conductive trace is formed in contact with the first magnetic layer. A sacrificial cooper layer protects the magnetic material from wet chemistry process steps. A conductive connection is formed from the conductive trace to the outside substrate, the conductive connection comprising a horizontal connection formed by in-layer plating. A second magnetic layer is formed in contact with the conductive trace. Instead of a horizontal connection, a vertical conductive connection can be formed that is perpendicular to the magnetic layers, by drilling a first via in a second of the magnetic layers, forming a buildup layer, and drilling a second via through the buildup layer, where the buildup layer protects the magnetic layers from wet chemistry processes.

12 Claims, 12 Drawing Sheets

(51) Int. Cl.
*H01F 17/00* (2006.01)
*H01L 23/00* (2006.01)

(52) U.S. Cl.
CPC ...... *H01L 24/08* (2013.01); *H01F 2017/0066* (2013.01); *H01F 2017/0086* (2013.01)

(56) References Cited

U.S. PATENT DOCUMENTS

2016/0322290 A1  11/2016  Ma et al.
2016/0322707 A1  11/2016  Nair et al.
2016/0372256 A1  12/2016  Mackh et al.

OTHER PUBLICATIONS

"International Application Serial No. PCT/US2019/033538, Written Opinion dated Sep. 11, 2019", 6 pgs.

\* cited by examiner

EMBEDDED MAGNETIC INDUCTOR

TECHNICAL FIELD

Magnetic inductors comprise magnetic materials such as film, paste, ink or other magnetic materials that have a high risk for leaching into standard wet chemistries in semiconductor substrate processing. The disclosed subject matter relates to new processes that provide very low exposure to such wet chemistry issues. Magnetic inductors exhibit improved operation as a result of the processes yielding a more intact magnetic layer. Further, the disclosed subject matter provides novel connections from the magnetic materials, which are within a substrate, to outside the substrate.

BACKGROUND

Embedded magnetic inductors will be used to meet next generation power delivery performance. These inductors contain magnetic materials such as film, paste, or ink. A critical issue encountered with magnetic materials is the leaching of the filler particles into tanks of desmear, elecdtroless/electolytic copper (Cu) deposition, etching and/or surface finish chemistries. The highest risk is encountered in surface finish due to two reasons: (1) if the magnetic material is printed on inductor traces with surface finish on them, the overall inductive performance is reduced; (2) in the alternative case of depositing surface finish after embedding the magnetic material, the filler leaching is inevitable because the pH range in a surface finish plating process can vary from 0-14. Consequently, there is a need for new and improved processes that mitigate against the issue of such leaching.

BRIEF DESCRIPTION OF THE DRAWINGS

FIG. 2A is a representation of a portion of a substrate on which magnetic materials for an inductor will be embedded, according to some embodiments of the disclosed subject matter.

FIG. 2B is a representation of laminating a buildup (BU) dielectric film onto a substrate layer, according to some embodiments of the disclosed subject matter.

FIG. 2C illustrates drilling a cavity for first embedded magnetic material, according to some embodiments of the disclosed subject matter.

FIG. 2D illustrates adding the magnetic material into the cavity of FIG. 2C, according to some embodiments of the disclosed subject matter.

FIG. 2E illustrates the embedding a sacrificial Cu layer, according to some embodiments of the disclosed subject matter.

FIG. 2F illustrates copper being electrolessly deposited on the BU dielectric film of FIG. 2B and on the top of the first magnetic material of FIG. 2D, according to some embodiments of the disclosed subject matter.

FIG. 2G illustrates results of a flash etch or laser ablate to remove electroless copper from the semiconductor structure, according to some embodiments of the disclosed subject matter.

FIG. 2H illustrates adding a layer of SR lamination as well as solder ball to the semiconductor structure, according to some embodiments of the disclosed subject matter.

FIG. 2I illustrates that a cavity has been drilled for placement of the second magnetic material, according to some embodiments.

FIG. 2J illustrates that a second layer of magnetic material is placed into the cavity of FIG. 2I, according to some embodiments.

FIG. 2K illustrates that the second layer of magnetic material has been provided, according to some embodiments.

FIG. 3A is a representation of a portion of a substrate on which magnetic materials for an inductor will be embedded, according to some embodiments of the disclosed subject matter.

FIG. 3B is a representation of laminating a first buildup (BU) dielectric film onto a substrate layer, according to some embodiments of the disclosed subject matter.

FIG. 3C illustrates drilling a cavity for first embedded magnetic material, according to some embodiments of the disclosed subject matter.

FIG. 3D illustrates adding the magnetic material into the cavity of FIG. 3C, according to some embodiments of the disclosed subject matter.

FIG. 3E illustrates the embedding a sacrificial Cu layer, according to some embodiments of the disclosed subject matter.

FIG. 3F illustrates adding a second BU lamination to the semiconductor structure and drilling a via to land on the inductor trace, according to some embodiment of the disclosed subject matter.

FIG. 3G illustrates etching the copper stop layer and adding a second layer of magnetic material, according to some embodiments of the disclosed subject matter.

FIG. 3H illustrates drilling a second via through the second magnetic material to land on the inductor trace, according to some embodiments of the disclosed subject matter.

FIG. 3I illustrates adding a third BU lamination layer to protect the magnetic material from wet chemistry process steps, according to some embodiments of the disclosed subject matter.

FIG. 3J illustrates drilling a third via through the BU lamination to land on the inductor trace, according to some embodiments of the disclosed subject matter.

FIG. 3K illustrates filling the via of FIG. 3J with copper and creating a pad for connection to the outside substrate, according to some embodiments of the disclosed subject matter.

DETAILED DESCRIPTION

Previous solutions to the problem of leaching when embedded magnetic inductor manufacturing processes are subjected to wet processing chemistries involve paste printing magnetic ink material onto a patterned panel or into a laser drilled cavity within a BU dielectric film. In most processes, a thin dielectric layer can be laminated over the magnetic material to mitigate interaction with wet chemistries. Otherwise the assumption is that the leaching will be manageable and alternative process flows will expose the magnetic material to wet chemistries.

Previous solutions require either an additional degree of exposure to wet chemistries compared to the process flows proposed herein or trigger the need for planarization, which would lead to substantial investment at manufacturers of magnetic inductor semiconductor components. While the lamination of a thin dielectric can protect the magnetic material from wet chemistry interactions, there will often be a separation between the inductor traces and the magnetic material. This may result in significant performance degradation. Finally, existing solutions allow the embedding of magnetic material to be only on one layer beneath the solder resist (SR) surface, encapsulated by magnetic material printed on the opposite side.

The disclosed solution to the above problem of wet chemistry exposure uses alternate process flows that invoke a copper (Cu) barrier to protect the magnetic material during processing. The disclosed solution is an improvement over prior solutions in that it provides elimination, or near elimination, of all wet chemistry interactions with the magnetic material of magnetic inductors. An additional improvement is that the process flows disclosed herein allow embedding of the inductor in any layer of a substrate, including within the SR layer, which will provide minimal distance to the die and enhance device performance. The disclosed process flows are believed to provide the least (or even zero) exposure of embedded magnetic conductors to wet chemistries, compared to other reasonable alternatives. In some embodiments, a laser stop may also be used with, or as part of, the CU barrier for protecting during a subsequent etching process.

Figure 1:
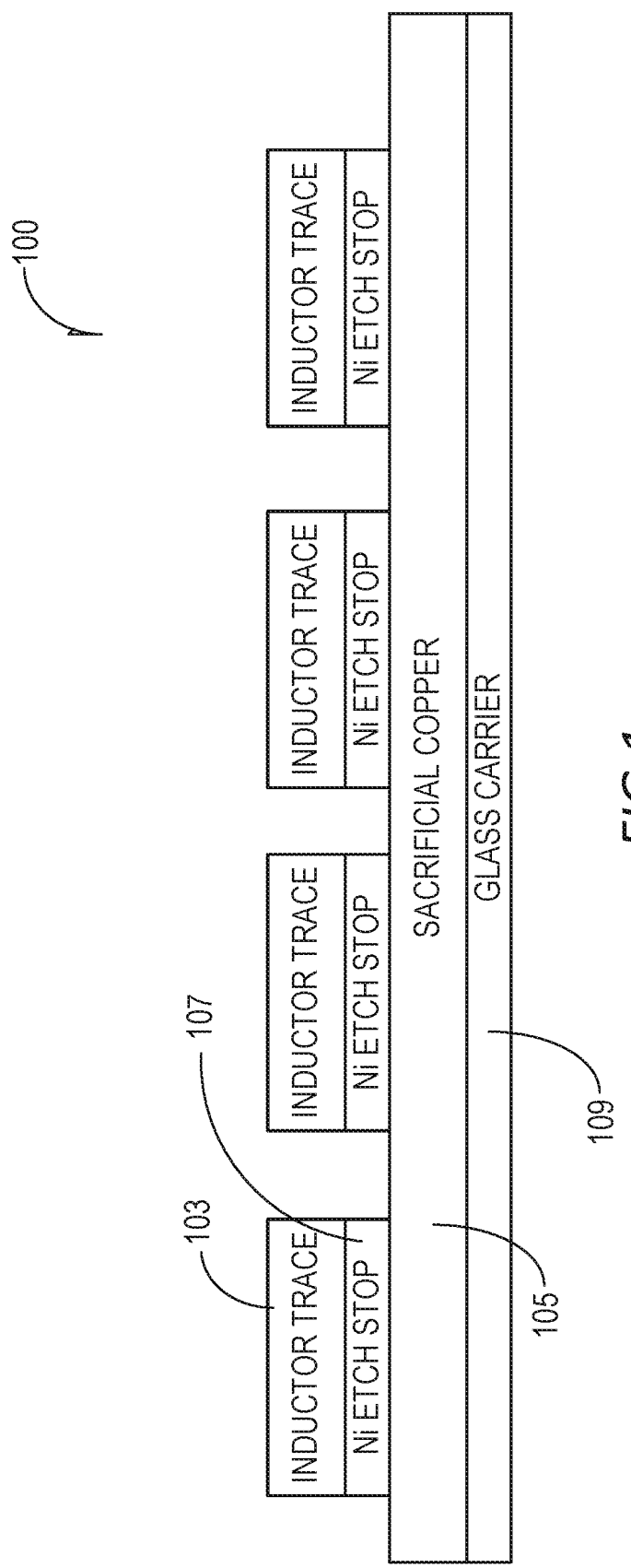
FIG. 1 is a representation of inductor traces implemented according to some embodiments of the disclosed subject matter.

FIG. 1 is a representation of inductor traces implemented according to some embodiments of the disclosed subject matter. In FIG. 1, a pre-formed Cu feature 100 comprises inductor traces such as 103 that are tethered together by a sacrificial copper layer 105 underneath the traces. A nickel (Ni) etch stop 107 may also be used as a protection for laser drilling steps. The entire feature may be manufactured on a glass carrier 109. In some embodiments, this feature may be laminated onto an uncured magnetic material during substrate manufacturing leading to the "embedding" described below. The sacrificial copper layer will act as a barrier layer to prevent the exposure of the magnetic material to wet chemistries and also, in some embodiments, as a laser stop when drilling a cavity for encapsulating an opposite side of the inductor trace with magnetic material, also described below.

Figure 2A:
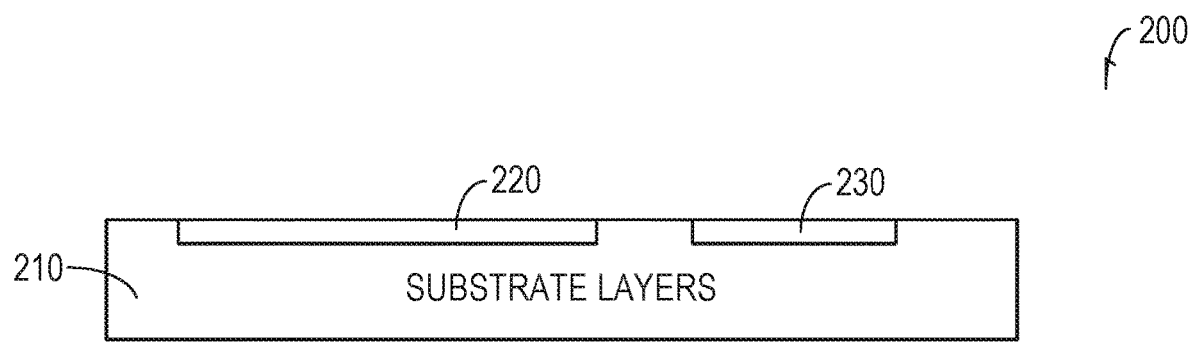
FIGS. 2A-2K are diagrams of a process flow according to some embodiments of the disclosed subject matter.
Figure 2B:
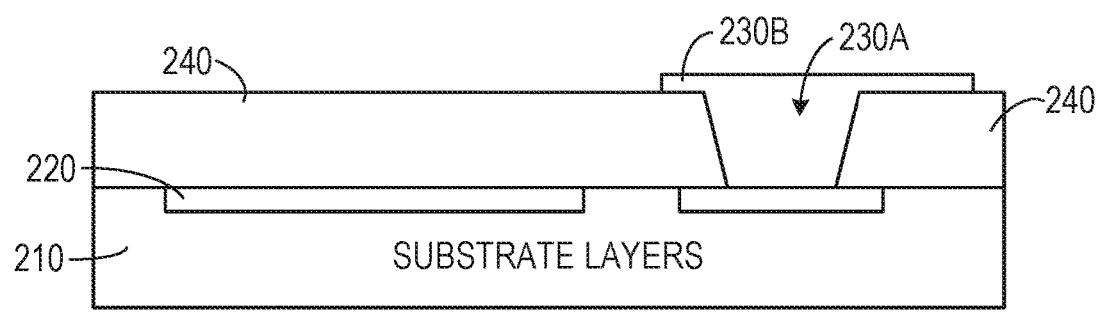

FIGS. 2A-2K are diagrams of a process flow according to some embodiments of the disclosed subject matter. FIG. 2A is a representation of a portion of a substrate 200 on which magnetic materials for an inductor will be embedded, according to some embodiments. The disclosed subject matter can be implemented at any of the layers 210 within the substrate, and copper traces 220, 230 may be patterned within the substrate by a conventional plating process. FIG. 2B is a representation of laminating a BU dielectric film 240 onto a substrate layer, according to some embodiments. The BU dielectric film 240 may be laminated on the substrate layers and on the copper traces 220, 230. The BU film in some embodiments comprises an organic material such as an epoxy resin film that has silica fillers in it and can be used to insulate the copper layers 220, 230 in the substrate. A via may be implemented by a laser process as at 230A, desmeared and copper plated as at 230B.

Figure 2C:
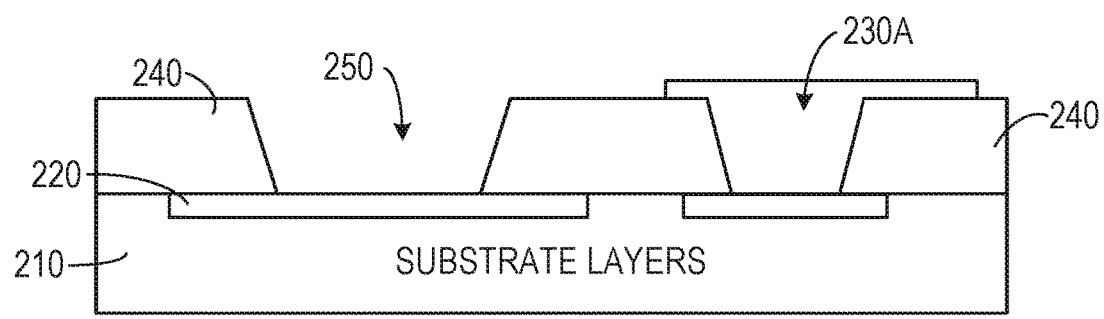
Figure 2D:
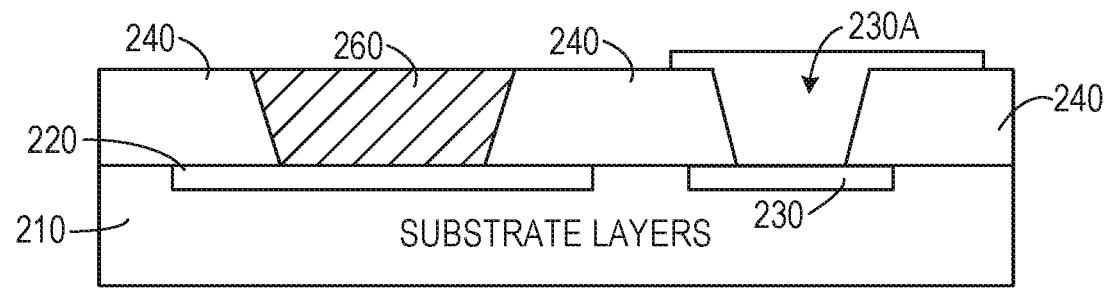
Figure 2E:
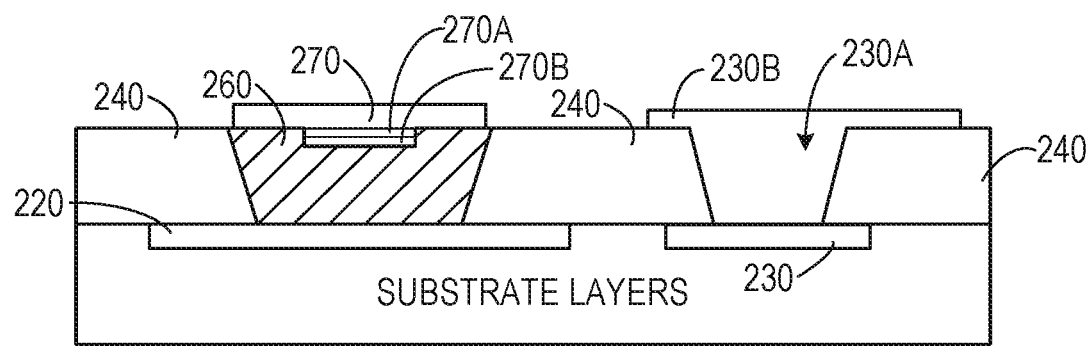

In some embodiments, the inductor feature comprises traces fully engulfed in magnetic material with the exception of a connecting trace or via that connects the inductor with the outside substrate. In some embodiments, the inductor comprises two embedded parts of magnetic material, each of which comprises a substantial part of, and in some cases approximately half of, the inductor. FIG. 2C illustrates drilling a cavity 250 for a first embedded magnetic material, according to some embodiments. The cavity 250 in practice will be much larger than copper plated via 230A, as is needed for inductor performance. FIG. 2D illustrates adding the magnetic material 260 into the cavity 250 of FIG. 2C which, in some embodiments, is by paste printing. A sacrificial copper (Cu) feature is inserted or embedded on top of the first magnetic material. FIG. 2E illustrates the embedding a sacrificial Cu layer 270, according to some embodiments. The Cu layer 270 may, in some embodiments, be pre-fabricated and may include laser stop 270A, which may be Ni in some embodiments. Adjacent the laser stop 270A may be Cu trace 270B. These latter two items are seen in a larger view as Ni etch stop 107 and inductor trace 103 in FIG. 1. The CU layer 270, laser stop 270A and Cu trace 270B of FIG. 2E will not be drawn in the following figures because of space limitation reasons. But the reader will understand that element 270 in the additional figures may include laser stop 270A and Cu trace 270B, according to some embodiments. This Cu layer 270, laser stop 270A and Cu trace 270B of FIG. 2E may be placed on or into magnetic material 260 by pick and place equipment. This pick and place equipment is much like well-known pick and place mechanisms that place capacitors on or within semiconductor circuits, where the capacitors are on sheets and are fed through the mechanism and placed at precise locations in semiconductor circuitry. The difference is that instead of a capacitor, the very small copper block 270 described above is picked and placed. The embedded Cu feature 270 may contain a layer of Cu that functions as a laser stop in a later process. The thickness of this copper can be optimized so that the first magnetic material, or first layer of magnetic film, is protected from subsequent wet chemistries, but thin enough so that subsequent laser drilling will fully ablate the Cu layer, thereby removing the need for an etching step. Therefore, because this copper layer is thin, the entire Cu feature may come with a glass carrier with a release agent to mitigate concerns of deformation or warpage.

After the Cu feature 270 is embedded in the first layer of magnetic material, a connecting trace may be established in some embodiments for connection to the outside substrate. For the connection, within-layer plating (meaning within a layer of the substrate) may be used. Electroless Cu deposition followed by photo resist lamination or photo resist development may be used in some embodiments to create the connecting trace pattern. Creating the connecting trace (or connector) pattern is described with respect to FIG. 2F.

Figure 2F:
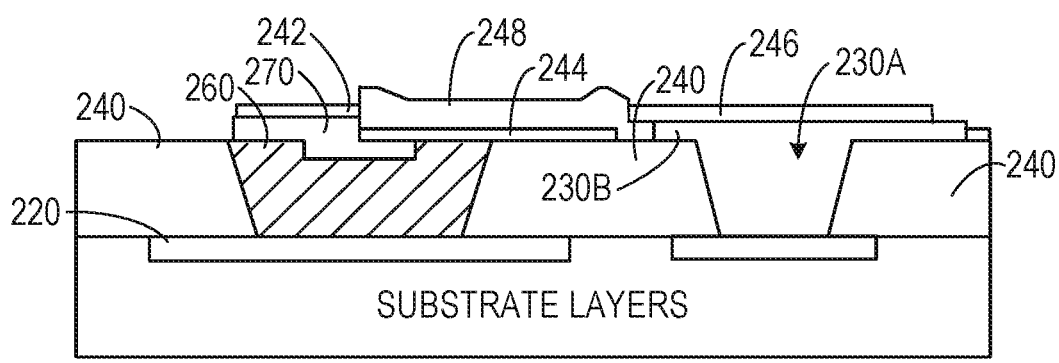
Figure 2G:
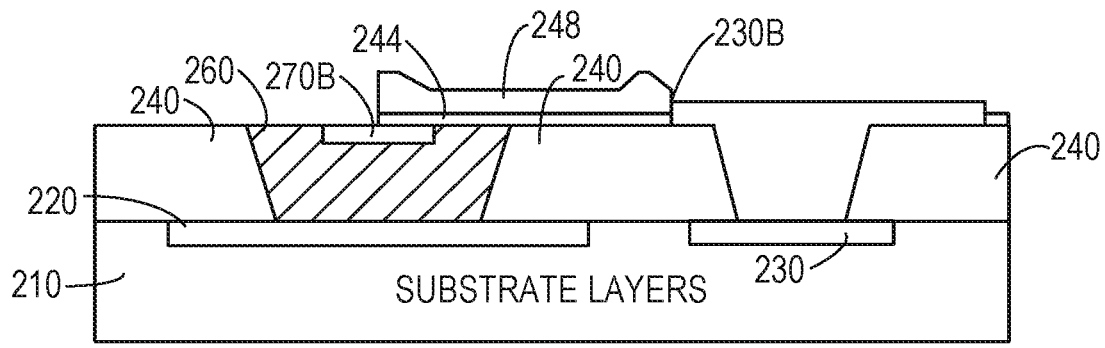

FIG. 2F illustrates a very thin layer of copper 242, 244, 246 being electrolessly deposited on the BU dielectric film of FIG. 2B and on the top of the first magnetic material 250 of FIG. 2D, according to some embodiments. This electroless Cu layer may be thought of as a seed layer for electrolytic Cu plating, which is seen at 248. The Cu trace 270B of CU feature 270 (FIG. 2E) is to be connected to the outside substrate. Via 230A has what is essentially a pad at 230B. In prior solutions, Cu feature 270 and pad 230B are not typically in place as they are in FIG. 2E. Connector 248 of FIG. 2F is implemented using electrolytic plating to connect existing Cu feature 270 and pad 230B, which comprises horizontal plating within a layer, which is not a usual process, but can be used because Cu feature 270 and pad 230B are in the same layer. Electrolytic plating, is considered an isotropic process, meaning that it tends to plate evenly In other words, the electrolytic plating should be plated essentially evenly on the electroless deposited Cu at 242. But because the existing Cu sacrificial layer 270 and the existing pad 230B (which is part of via 230A in some embodiments) are in place, the plating 248 near 270 and near pad 230B, will have a non-uniform horn-like feature, or bulge, giving the connector a dual-horn appearance. This may be considered an artifact of the process of horizontal plating within a layer. The location of connecter 248 may migrate closer to, or become part of, Ni etch stop 270A or copper trace 2709 as illustrated in FIG. 2F. The location of connector 248 with respect to the copper trace depends on the placement of the usual photoresist of the previous plating step. At this point, with the sacrificial Cu feature 270 in place, the steps of planned further processing may be undertaken, including wet chemistry steps, with the inductor 260 being protected from wet chemistry issues, such as leaching discussed above, by the Cu feature 270 and, in some embodiments, by connector 248. FIG. 2G illustrates results of a flash etch or laser ablate to remove any remnants of sacrificial Cu 270 that may not have been ablated in an earlier laser drilling step, and remove electroless copper 244, 246 from the semiconductor structure, according to some embodiments. At this point, in some embodiments, another BU layer could be added and semi-additive processes may take place. This means that the disclosed process can be implemented at essentially any layer of the substrate, to include semi-additive processes, before taking the finishing process steps discussed next.

Figure 2H:
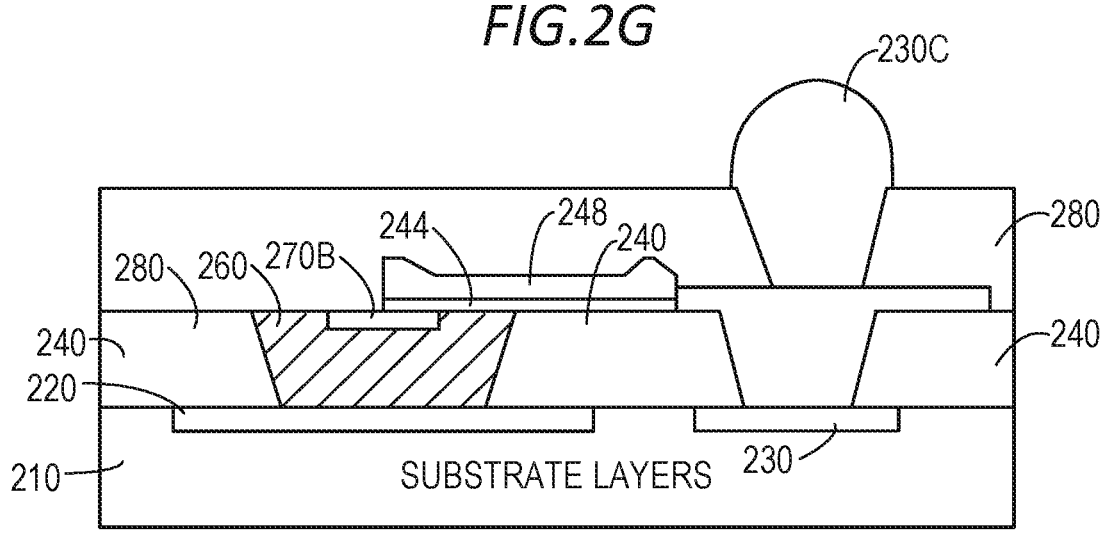
Figure 2I:
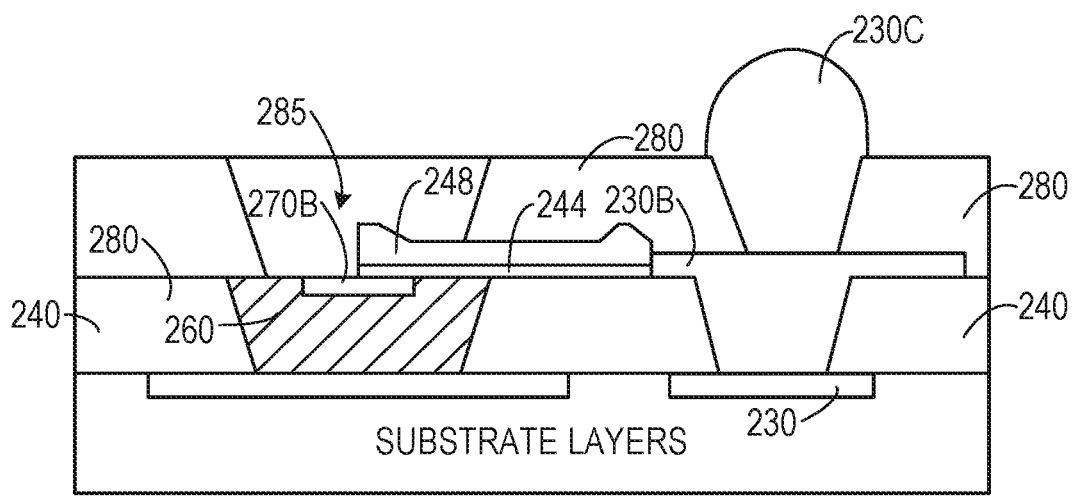
Figure 2J:
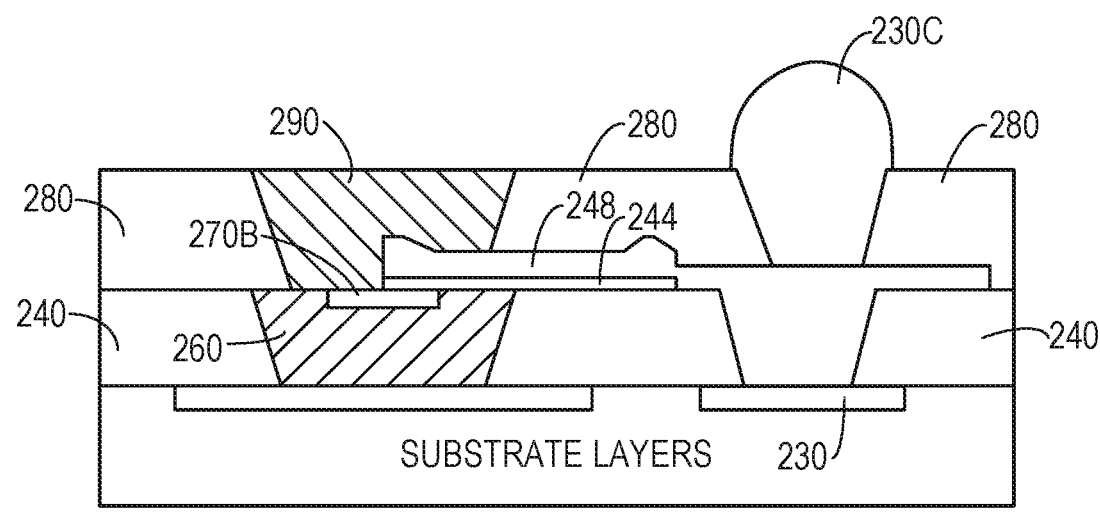
Figure 2K:
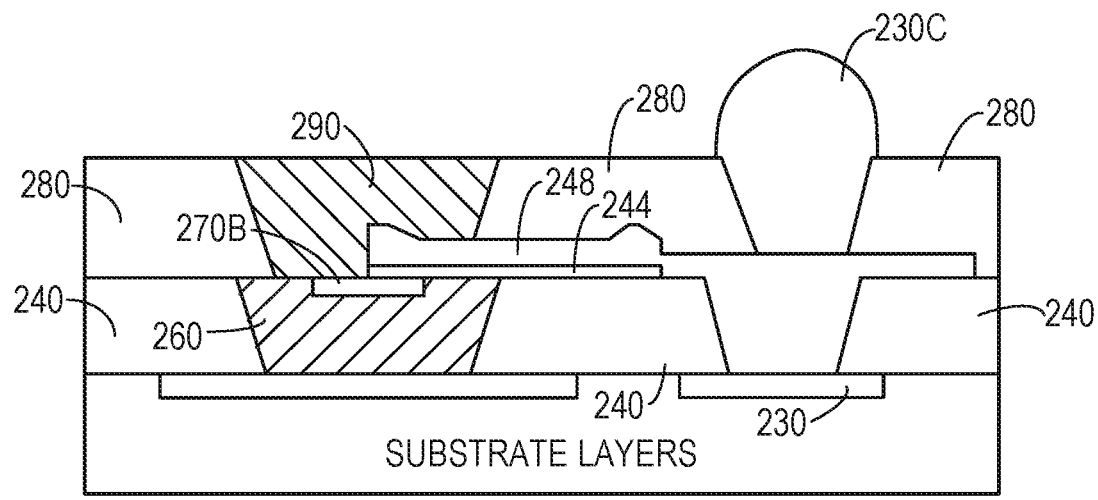

After the semi-additive processes, or if no semi-additive process is used, an SR layer may laminated or otherwise applied to the structure. FIG. 2H illustrates adding a layer of SR lamination 280 as well as solder ball 230C to the semiconductor structure, according to some embodiments. FIG. 2I illustrates that a cavity 285 has been drilled, according to some embodiments, for placement of the second magnetic material. In some embodiments the first magnetic material is the same as the first magnetic material. In some embodiments magnetic material may be considered a magnetic layer or a magnetic film. The cavity may be drilled by a laser process. Ideally, the laser-drilled cavity would be to the edge of the laser stop, including a worst cases tolerance, where the laser drilled cavity could be over the edge of the laser stop 270A. The second layer of magnetic material when added into the cavity will provide a complete magnetic material encapsulation of the copper trace 270A. FIG. 2I illustrates that a flash etch of the embedded Cu in the cavity 270A has been performed to remove the laser stop, according to some embodiments. This exposes the first magnetic material to flash etch chemistry. FIG. 2J illustrates that a second layer of magnetic material may be placed into the cavity 270A, according to some embodiments. FIG. 2K illustrates that the second layer of magnetic material, 290 has been provided, in some embodiments by paste printing, to form the final product. The final product comprises magnetic material parts 250, 290 encapsulating copper trace 270 which provides the inductor a connection to the outside substrate via connector 248 to pad 230B of via 230A, and to solder ball 230C.

The above-disclosed process flow uses within-layer plating to make a horizontal connection from the copper trace of the inductor to the outside substrate, according to some embodiments. FIGS. 3A-3K are diagrams of a second process flow according to other embodiments of the disclosed subject matter. In this second process flow, a vertical connection is made from the copper trace of the inductor to the outside substrate, according to some embodiments.

Figure 3A:
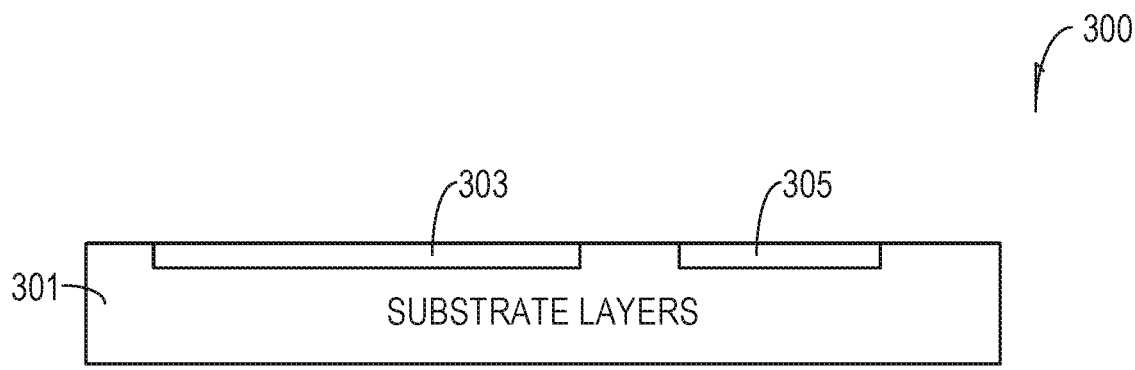
FIGS. 3A-3K are diagrams of a process flow according to other embodiments of the disclosed subject matter.
Figure 3B:
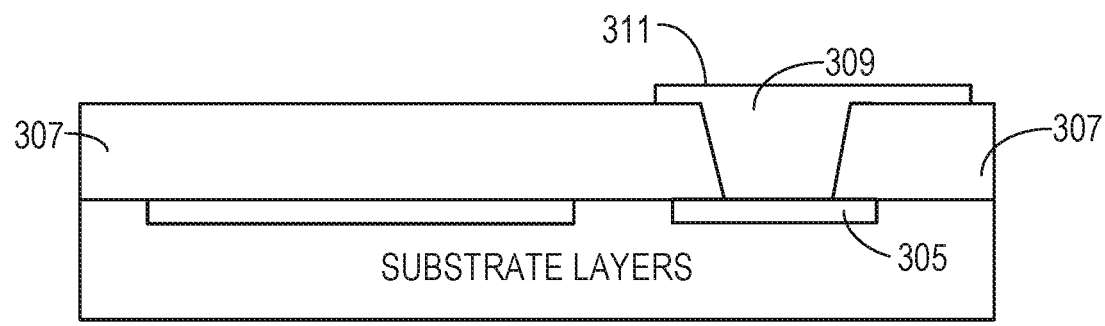
Figure 3C:
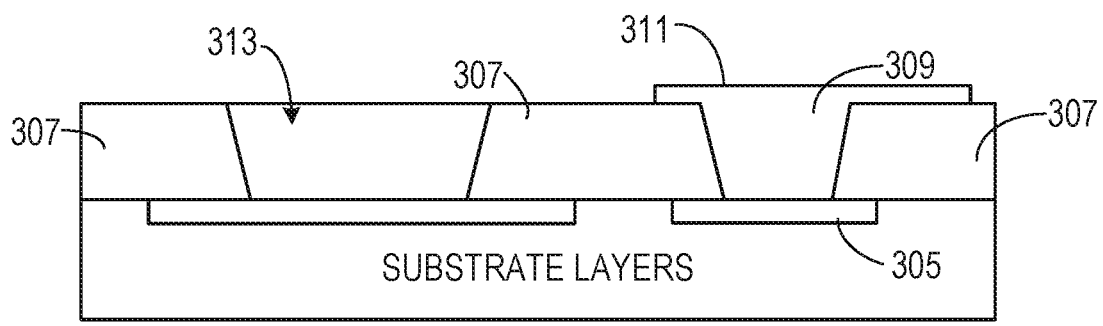

FIGS. 3A-3C are essentially identical to FIGS. 2A-2C. For example, FIG. 3A is a representation of a portion of a substrate 300 on which magnetic materials for an inductor will be embedded, according to some embodiments. The disclosed subject matter can be implemented at any of the layers 301 within the substrate, and copper traces 303, 305 may be patterned within the substrate by a conventional plating process. FIG. 3B is a representation of laminating a first buildup (BU) dielectric film 307 onto a substrate layer, according to some embodiments. The BU dielectric film 307 may be laminated on the substrate layers and on the copper traces 303, 305. A via may be implemented by a laser process as at 309, desmeared and copper plated as at 311.

Figure 3D:
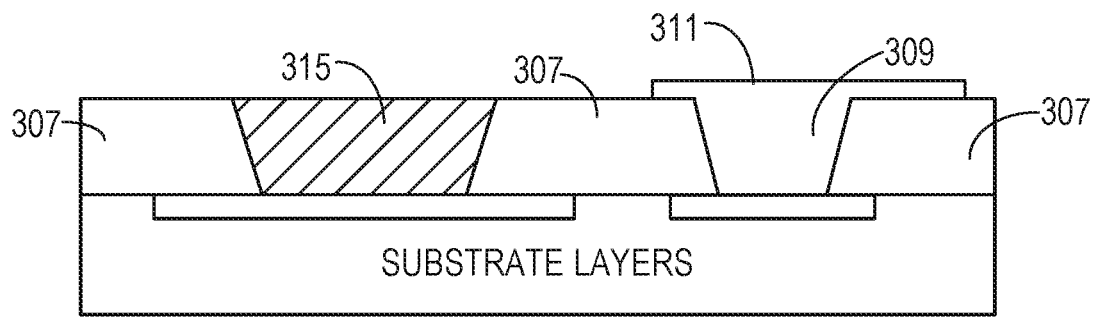
Figure 3E:
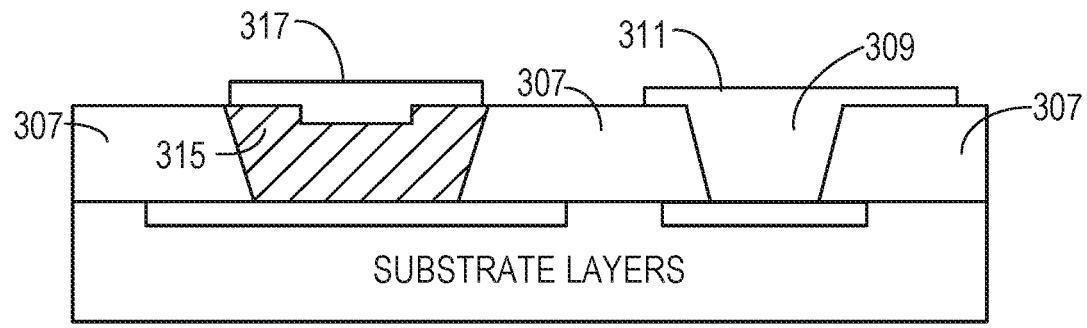

In some embodiments, the inductor feature comprises traces fully engulfed in magnetic material with the exception of a connecting trace or via that connects the inductor with the outside substrate. In some embodiments, the inductor comprises two embedded parts of magnetic material, each of which comprises a substantial part of, and in some cases approximately half of, the inductor. FIG. 3C illustrates drilling a cavity 313 for a first embedded magnetic material, according to some embodiments. The cavity 313 in practice will be much larger than copper plated via 311, as is needed for inductor performance. FIG. 3D illustrates adding the magnetic material 315 into the cavity 313 of FIG. 3C, according to some embodiments. FIG. 3E illustrates the embedding a Cu layer 317, according to some embodiments. The Cu layer 317 may, in some embodiments, be pre-fabricated and may include laser stop, which may be Ni in some embodiments. This Cu layer 317 and laser stop of FIG. 3E may be placed on or into magnetic material 315 by pick and place equipment, with the laser stop placed in a notch of the magnetic material, one side of which is illustrated at 317 in FIG. 3E.

Figure 3F:
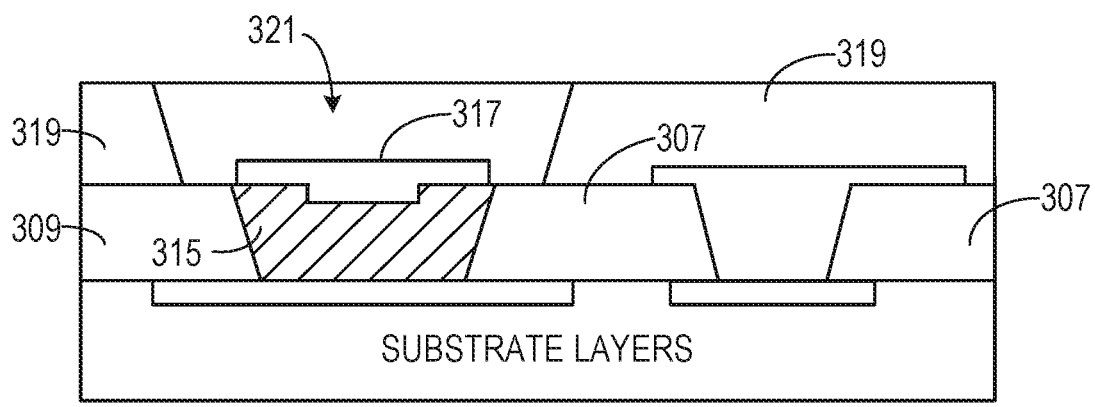
Figure 3G:
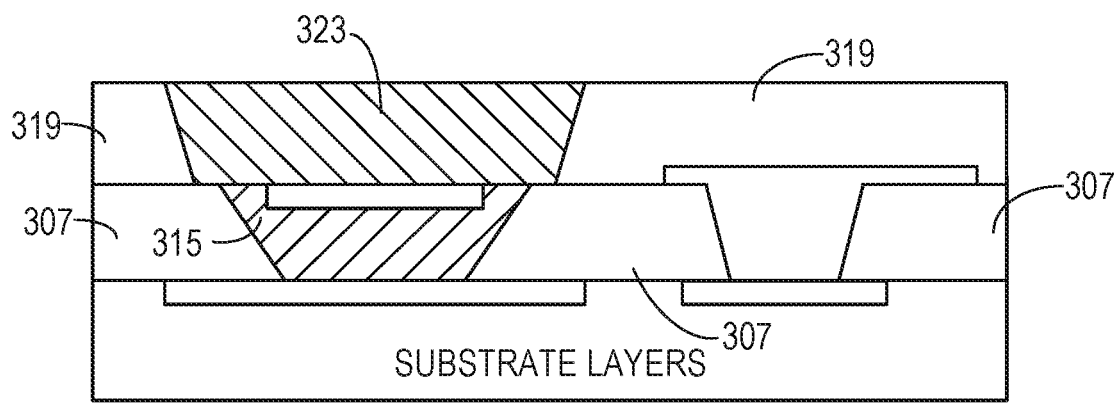
Figure 3H:
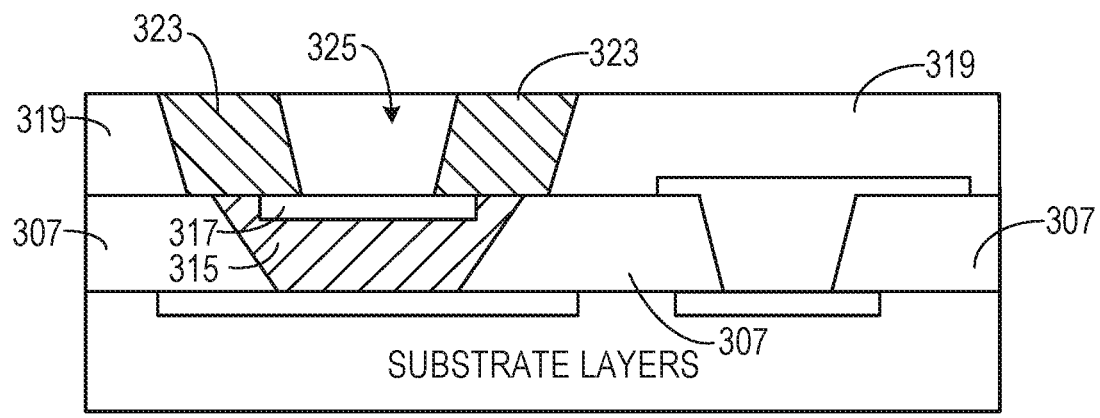
Figure 3I:
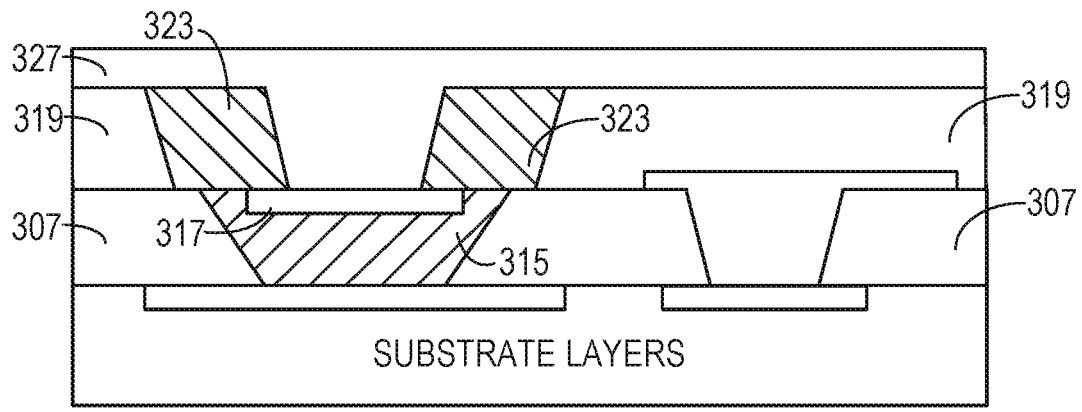
Figure 3J:
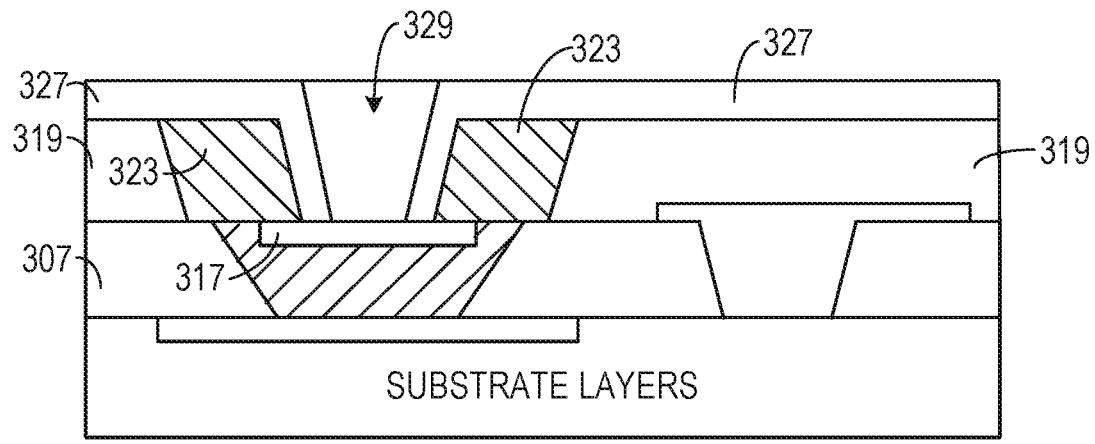
Figure 3K:
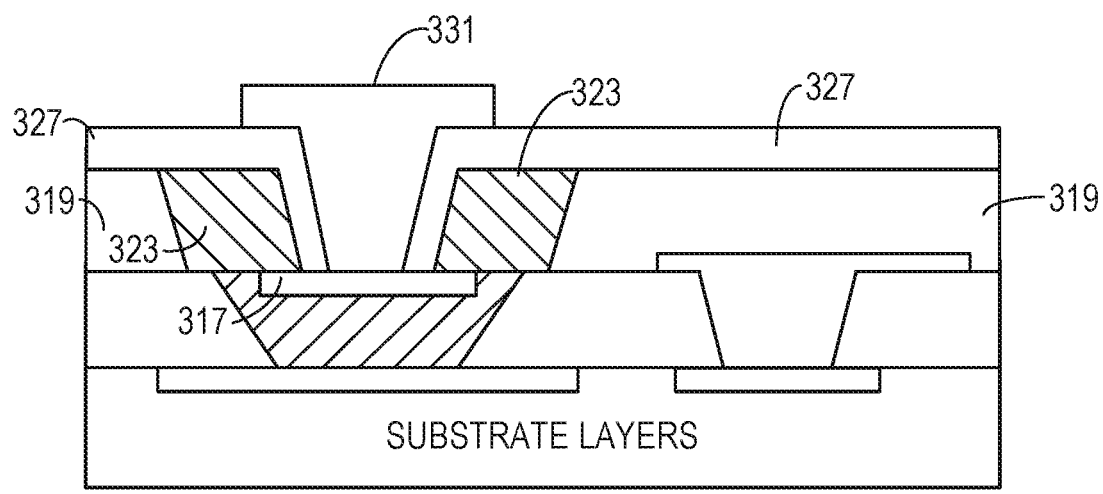

FIG. 3F illustrates adding a second BU layer 319 to the semiconductor structure and drilling a second cavity 321 to land on the inductor trace 317, according to some embodiments. In some embodiments the second cavity is above the first cavity and has essentially the same axis perpendicular to the semiconductor structure as does the first cavity. FIG. 3G illustrates etching the copper stop layer for ablation purposes and adding a second layer of magnetic material 323, according to some embodiments. FIG. 3H illustrates drilling a first via 325 through the second magnetic material to land on the inductor trace, according to some embodiments. FIG. 3I illustrates adding a third, thin BU lamination layer 327 to protect the magnetic material from wet chemistry process steps, according to some embodiments. FIG. 3J illustrates drilling a second via, 329, through the third BU lamination layer 327 to land on the inductor trace 317, according to some embodiments. The second via 329 is through the BU layer only, such that the BU layer 327 protects the magnetic material 327 from wet chemistry steps that may follow the laser drilling step. FIG. 3K illustrates filling the via 329 of FIG. 3J with copper and creating a pad 331 for connection to the outside substrate, according to some embodiments.

Figure 4:
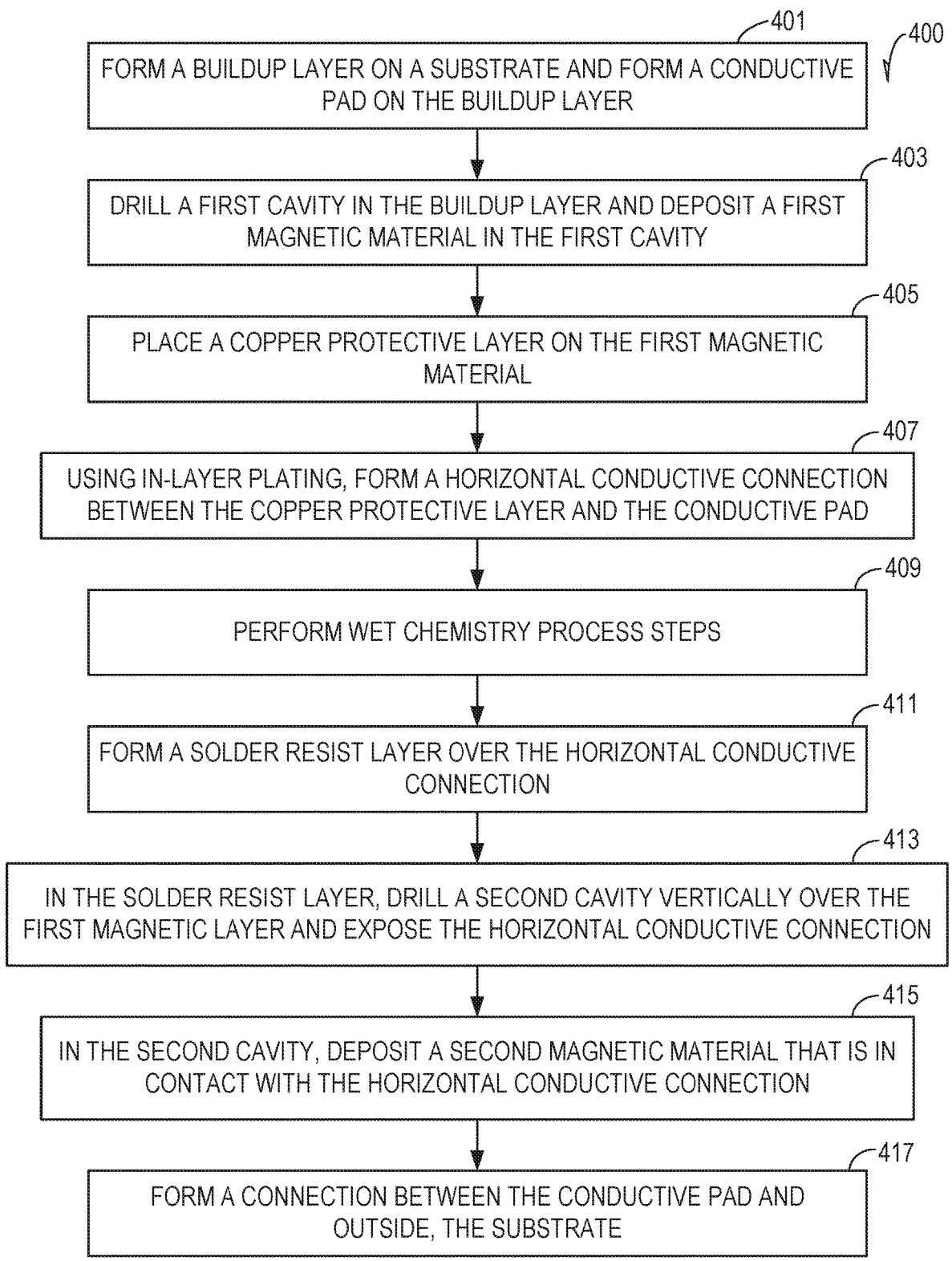
FIG. 4 is a flowchart describing a process flow according to some embodiments of the disclosed subject matter.

FIG. 4 is a flowchart describing a process flow according to some embodiments of the disclosed subject matter. At 401, a buildup (BU) layer is formed on a substrate and a conductive pad is formed on the BU layer. At 403, a first cavity is drilled in the BU layer and a first magnetic material is deposited in the first cavity. At 405, a copper protective layer is placed or formed on the first magnetic material. At 407, in-layer plating is used to form a horizontal conductive connection between the copper protective layer and the conductive pad. At 409, wet chemistry process steps may be performed. At 411, a solder resist (SR) layer is formed over the horizontal conductive connection. At 413, in the SR layer a second cavity is drilled vertically over the first magnetic layer and exposes the horizontal conductive connection. At 415, in the second cavity, a second magnetic material is deposited that is in contact with the horizontal conductive connection. At 417, a connection between the conductive pad and outside the substrate is formed.

Figure 5:
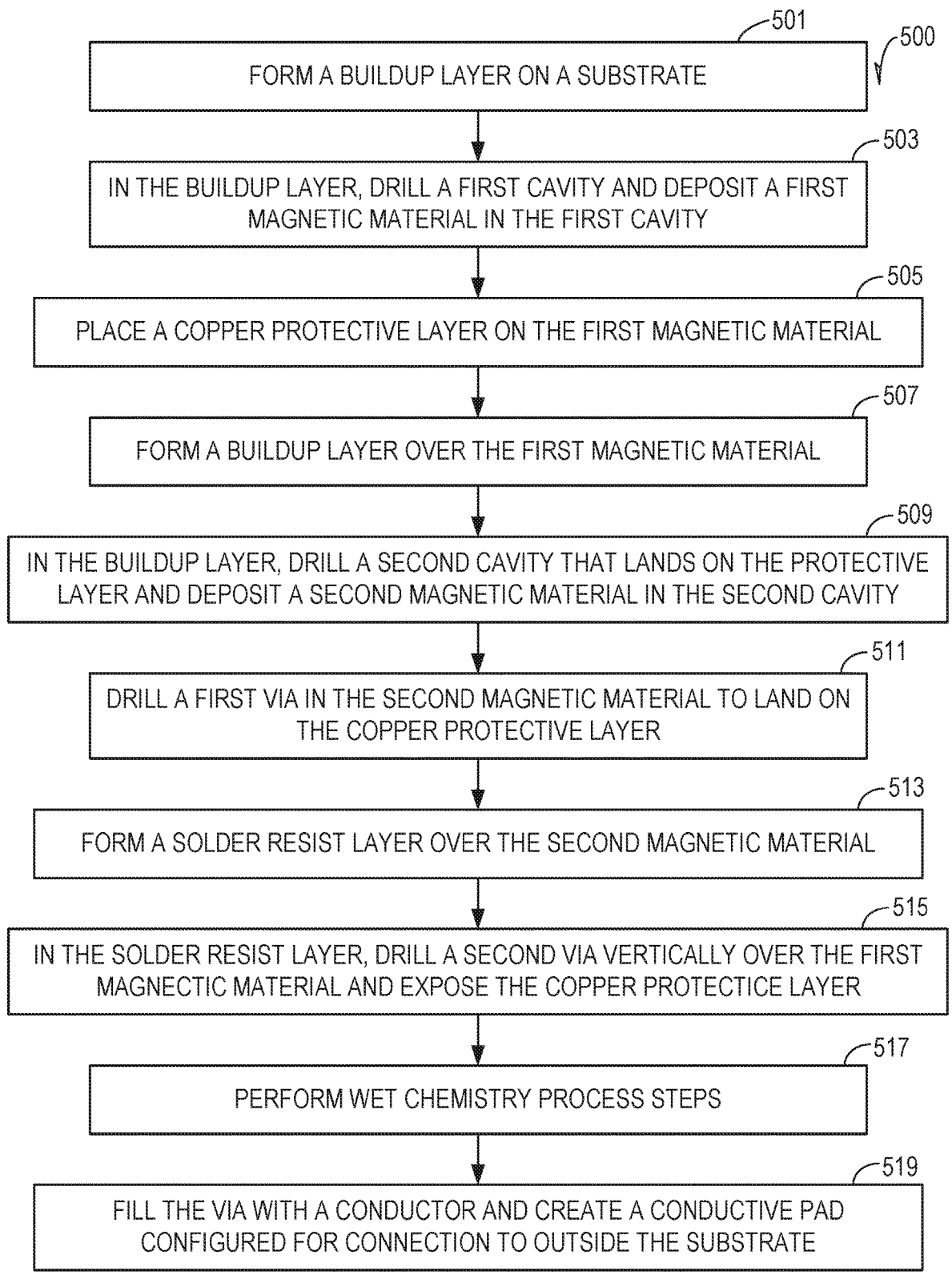
FIG. 5 is a flowchart describing a process flow according to other embodiments of the disclosed subject matter.

FIG. 5 is a flowchart describing a process flow according to other embodiments of the disclosed subject matter. At 501, a BU layer is formed on a substrate. At 503, a first cavity is drilled in the BU layer and a first magnetic material is deposited in the first cavity. At 505, a copper protective layer is placed or formed on the first magnetic material. At 507, a BU layer is forming over the first magnetic material. At 509, a second cavity that lands on the copper protective layer is drilled and a second magnetic material is deposited in the second cavity. At 511, a first via is drilled in the second magnetic material to land on the copper protective layer. At 513, a solder resist layer is formed over the second magnetic material. At 515, in the solder resist layer, a second via is drilled vertically over the first magnetic material and exposes the copper protective layer. At 517, wet chemistry process steps may be performed. At 519, the second via is filled with a conductor and a conductive pad is created that is configured for connection to the outside substrate.

Figure 6:
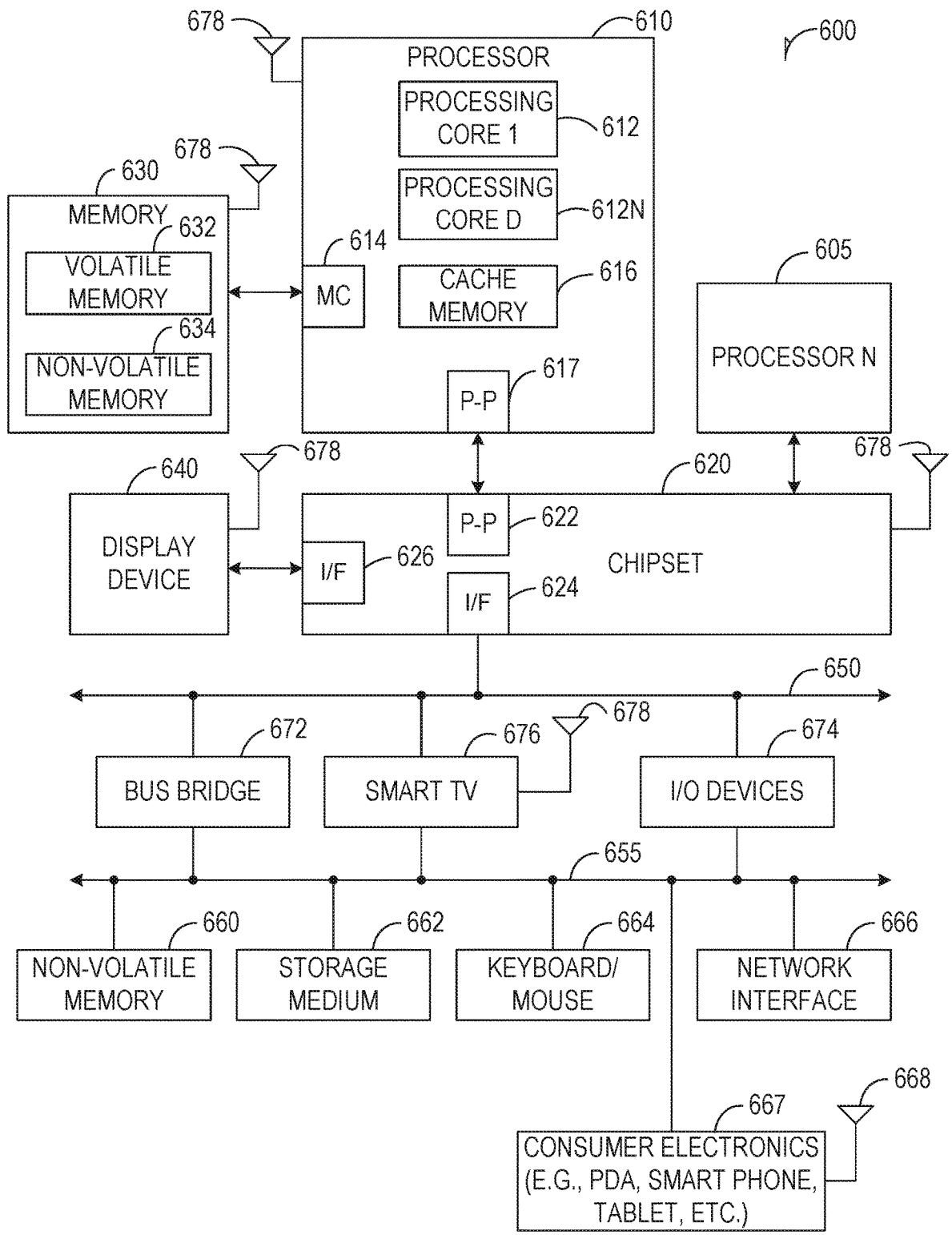
FIG. 6 is a block diagram of an example machine with which any one or more of the techniques or methodologies discussed herein may be performed, or in which apparatus or components discussed herein may be incorporated or used, according to some aspects of the disclosed subject matter.

FIG. 6 is a block diagram of an example machine upon which any one or more of the techniques or methodologies discussed herein may be performed, or in which apparatus or components discussed herein may be incorporated or used, according to some aspects of the present disclosure. FIG. 6 is included to show an example of a higher level device application for integrated circuits employing embedded magnetic inductors described herein. In one embodiment, system 600 includes, but is not limited to, a desktop computer, a laptop computer, a netbook, a tablet, a notebook computer, a personal digital assistant (PD A), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chip set 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chip set 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 667, and various forms of consumer electronics 677 (such as a PDA, smart phone, tablet etc.), etc. In one embodiment, chip set 620 couples with these devices through an interface 624. Chip set 620 may also be coup led to a wireless antenna 678 to communicate with any device configured to transmit and/or receive wireless signals.

Chip set 620 connects to display device 640 via interface 626. Display 640 may be, for example, a liquid crystal display (LCD), a plasma display, cathode ray tube (CRT) display, or any other form of visual display device. In some embodiments of the example system, processor 610 and chip set 620 are merged into a single SOC. In addition, chip set 620 connects to one or more buses 650 and 655 that interconnect various system elements, such as I/O devices 674, nonvolatile memory 660, storage medium 662, a keyboard/mouse 664, and network interface 667. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 667 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected embodiments of 616) can be incorporated into processor core 612.

EXAMPLES

Example 1 is a semiconductor circuit comprising: a substrate that includes a plurality of parallel layers; a first magnetic material in contact with one layer of the plurality of parallel layers; a conductive trace in contact with the first magnetic material; a second magnetic material in contact with a second layer of the plurality of parallel layers, the second magnetic material in contact with the conductive trace; and a conductive connection from the conductive trace to the outside substrate, the conductive connection comprising a horizontal connection.

In Example 2, the subject matter of Example 1 optionally includes a conductive pad spaced horizontally from the conductive trace and in contact with the conductive connection.

In Example 3, the subject matter of Example 2 optionally includes wherein the conductive pad is connected to or part of a via.

In Example 4, the subject matter of any one or more of Examples 2-3 optionally include a conductive connection between the conductive pad and the outside substrate.

In Example 5, the subject matter of Example 4 optionally includes wherein the conductive connection between the conductive pad and outside the substrate comprises a solder ball.

In Example 6, the subject matter of any one or more of Examples 1-5 optionally include wherein the conductive trace and the conductive pad are on the same layer.

In Example 7, the subject matter of any one or more of Examples 1-6 optionally include wherein the one layer comprises a first buildup (BU) layer and the conductive pad is formed on the first BU layer.

In Example 8, the subject matter of Example 7 optionally includes wherein the first BU layer includes a first cavity and the first magnetic material is in the first cavity.

In Example 9, the subject matter of Example 8 optionally includes a solder resist (SR) layer above the first BU layer.

In Example 10, the subject matter of Example 9 optionally includes wherein the SR layer includes a second cavity and the second magnetic material is in the second cavity.

In Example 11, the subject matter of any one or more of Examples 9-10 optionally include wherein the second magnetic material is in contact with the first magnetic material.

In Example 12, the subject matter of any one or more of Examples 10-11 optionally include wherein the second cavity is formed in a layer that is parallel to a layer that defines the first cavity.

In Example 13, the subject matter of any one or more of Examples 1-12 optionally include wherein a second BU layer is below the SR layer, the second BU layer comprising at least one trace.

Example 14 is a computer processor comprising: one or more processor cores; memory; and a memory controller, wherein at least one of the one or more processor cores, memory, or memory controller includes an electronic circuit that comprises a substrate that includes a plurality of parallel layers; a first magnetic material in contact with one layer of the plurality of parallel layers; a conductive trace in contact with first magnetic material; a second magnetic material in contact with a second layer of the plurality of parallel layers, the second magnetic material in contact with the conductive trace; and a conductive connection from the conductive trace to the outside substrate, the conductive connection comprising a horizontal connection.

In Example 15, the subject matter of Example 14 optionally includes a conductive pad spaced horizontally from the conductive trace and in contact with the conductive connection.

In Example 16, the subject matter of Example 15 optionally includes wherein the conductive pad is connected to or part of a via.

In Example 17, the subject matter of any one or more of Examples 15-16 optionally include a conductive connection between the conductive pad and the outside substrate.

In Example 18, the subject matter of any one or more of Examples 14-17 optionally include wherein the conductive trace, the horizontal connection and the conductive pad are in the same layer.

In Example 19, the subject matter of any one or more of Examples 14-18 optionally include wherein the one layer comprises a first buildup (BU) layer and the conductive pad is formed on the first BU layer.

In Example 20, the subject matter of Example 19 optionally includes wherein the first BU layer includes a first cavity and the first magnetic material is in the first cavity.

In Example 21, the subject matter of Example 20 optionally includes a solder resist (SR) layer above the first BU layer.

In Example 22, the subject matter of Example 21 optionally includes wherein the SR layer includes a second cavity and the second magnetic material is in the second cavity.

In Example 23, the subject matter of Example 22 optionally includes wherein the second magnetic material is in contact with the first magnetic material.

Example 24 is a method comprising: providing a substrate that includes a plurality of parallel layers; forming a first magnetic material in contact with one layer of the plurality of parallel layers; forming a protective conductive layer in contact with the first magnetic material; using in-layer plating forming a conductive connection between the protective conductive layer and a conductive pad; and forming a second magnetic material in contact with the first magnetic material and in contact with the conductive connection.

In Example 25, the subject matter of Example 24 optionally includes forming the conductive pad in the same layer as, and horizontal to, the protective conductive layer.

In Example 26, the subject matter of any one or more of Examples 24-25 optionally include wherein the protective conductive layer comprises a prefabricated copper block, the method further comp rising picking the copper block and p lacing the copper block onto or into the first magnetic material.

In Example 27, the subject matter of any one or more of Examples 24-26 optionally include wherein the protective layer comprises a laser stop.

In Example 28, the subject matter of any one or more of Examples 24-27 optionally include using electroless and electrolytic copper plating for forming the conductive connection.

In Example 29, the subject matter of any one or more of Examples 24-28 optionally include forming a conductive connection between the conductive pad and the outside substrate.

In Example 30, the subject matter of any one or more of Examples 24-29 optionally include forming a first buildup (BU) layer on the one layer, drilling a first cavity in the BU layer and forming the first magnetic material in the first cavity.

In Example 31, the subject matter of Example 30 optionally includes forming a solder resist (SR) layer above the first BU layer and drilling a second cavity in the SR layer.

In Example 32, the subject matter of Example 31 optionally includes ablating the embedded protective conductive layer and forming the second magnetic material in the second cavity.

In Example 33, the subject matter of any one or more of Examples 24-32 optionally include forming the first magnetic material and the second magnetic material by a printing process.

In Example 34, the subject matter of any one or more of Examples 31-33 optionally include wherein the second cavity is above and axially perpendicular to the first cavity.

In Example 35, the subject matter of any one or more of Examples 24-34 optionally include wherein the conductive pad is part of a via.

In Example 36, the subject matter of any one or more of Examples 25-35 optionally include ablating or otherwise removing the protective conductive layer after wet chemistry processes are performed.

In Example 37, the subject matter of any one or more of Examples 31-36 optionally include forming a second BU layer above the first BU layer and below the SR layer, and performing a semi-additive process in the second BU layer.

Example 38 is a semiconductor circuit comprising a substrate that includes a plurality of parallel layers; a first magnetic material in contact with one layer of the plurality of parallel layers; a conductive trace in contact with first magnetic material; a second magnetic material located parallel to the first magnetic material, the second magnetic material in contact with the first magnetic material and in contact with the conductive trace; and a conductive connection from the conductive trace to the outside substrate.

In Example 39, the subject matter of Example 38 optionally includes wherein the conductive connection is perpendicular to the first magnetic material and to the second magnetic material.

In Example 40, the subject matter of any one or more of Examples 38-39 optionally include a first BU layer and a first cavity in the first BU layer, wherein the first magnetic material is in the first cavity.

In Example 41, the subject matter of any one or more of Examples 38-40 optionally include a second BU layer and a second cavity in the second BU layer, wherein the second cavity is perpendicular to the first cavity and the second magnetic material is in the second cavity.

In Example 42, the subject matter of any one or more of Examples 38-41 optionally include a first via in the second magnetic material, the first via in contact with the conductive trace.

In Example 43, the subject matter of any one or more of Examples 38-42 optionally include a third BU layer in contact with the second magnetic material and with the conductive trace, wherein a second via is included in the third BU layer and the conductive connection is part of the second via.

In Example 44, the subject matter of any one or more of Examples 38-43 optionally include wherein the conductive connection comprises a conductive pad.

Example 45 is a computer processor comprising: one or more processor cores; memory; and a memory controller, wherein at least one of the one or more processor cores, memory, or memory controller includes an electronic circuit that comprises: a substrate that includes a plurality of parallel layers; a first magnetic material in contact with one layer of the plurality of parallel layers; a conductive trace in contact with first magnetic material; a second magnetic material located parallel to the first magnetic material, the second magnetic material in contact with the first magnetic material and in contact with the conductive trace; and a conductive connection from the conductive trace to the outside substrate.

In Example 46, the subject matter of Example 45 optionally includes wherein the conductive connection is perpendicular to the first magnetic material and to the second magnetic material.

In Example 47, the subject matter of any one or more of Examples 45-46 optionally include a first BU layer and a first cavity in the first BU layer, wherein the first magnetic material is in the first cavity.

In Example 48, the subject matter of any one or more of Examples 45-47 optionally include a second BU layer and a second cavity in the second BU layer, wherein the second cavity is perpendicular to the first cavity and the second magnetic material is in the second cavity.

In Example 49, the subject matter of any one or more of Examples 45-48 optionally include a first via in the second magnetic material, the first via in contact with the conductive trace.

In Example 50, the subject matter of any one or more of Examples 45-49 optionally include a third BU layer in contact with the second magnetic material and with the conductive trace, wherein a second via is included in the third BU layer and the conductive connection is part of the second via.

In Example 51, the subject matter of any one or more of Examples 45-50 optionally include wherein the conductive connection comprises a conductive pad.

Example 52 is a method comprising: providing a substrate that includes a plurality of parallel layers; forming a first magnetic material in contact with one layer of the plurality of parallel layers; forming a first protective layer to protect the first magnetic material from wet chemistry processes; forming a conductive trace in contact within the first magnetic material; forming a second magnetic material parallel to the first magnetic layer and in contact with the first magnetic material and in contact with the conductive trace; forming a second protective layer to protect the second magnetic material from wet chemistry processes; and forming a conductive connection from the conductive trace to the outside substrate, the conductive connection comprising a via through the second magnetic material.

In Example 53, the subject matter of Example 52 optionally includes wherein forming first protective layer comprises embedding a copper block in the first magnetic.

In Example 54, the subject matter of Example 53 optionally includes wherein forming a conductive trace in contact within the first magnetic material comprises etching the copper block.

In Example 55, the subject matter of any one or more of Examples 52-54 optionally include forming a first BU layer on the substrate, forming a first cavity in the first BU layer and printing the first magnetic material in the first cavity.

In Example 56, the subject matter of any one or more of Examples 52-55 optionally include forming a second BU layer parallel to the first BU layer, forming a second cavity in the second BU layer and printing the second magnetic material in the second cavity.

In Example 57, the subject matter of any one or more of Examples 52-56 optionally include forming a third BU layer parallel to the second BU layer, the third BU layer in contact with the second magnetic layer.

In Example 58, the subject matter of any one or more of Examples 52-57 optionally include wherein forming a conductive connection from the conductive trace to the outside substrate comprises drilling a first via in the second. BU layer and drilling a second via within the third BU layer, wherein the second via is within the first via, and a part of the third BU layer that is in contact with the second via comprises the second protective layer.

In Example 59, the subject matter of Example 58 optionally includes wherein the first via is perpendicular to the conductive trace.

In Example 60, the subject matter of any one or more of Examples 58-59 optionally include wherein the second via is narrower than the first via.

In Example 61, the subject matter of any one or more of Examples 58-60 optionally include wherein the conductive connection comprises a conductive pad.

In Example 62, the subject matter can include, or can optionally be combined with any portion or combination of, any portions of any one or more of Examples 1 through 61 to include, subject matter that can include means for performing any one or more of the functions of Examples 1 through 61, or a machine-readable medium including instructions that, when performed by a machine, cause the machine to perform any one or more of the functions of Examples 1 through 61.

Examples, as described herein, may include, or may operate on, logic or a number of components, modules, or mechanisms. Modules are tangible entities (e.g, hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

We claim:

1. A semiconductor circuit comprising:
    a substrate that includes a plurality of parallel layers;
    a first magnetic material in contact with a first layer of the plurality of parallel layers;
    a second magnetic material in contact with a second layer of the plurality of parallel layer;
    a conductive trace embedded within one of more of the first magnetic material or the second magnetic material;
    a conductive connection from the conductive trace to the outside substrate, the conductive connection comprising a horizontal connection.

2. The semiconductor circuit of claim 1 further comprising a conductive pad spaced horizontally from the conductive trace and in contact with the conductive connection.

3. The semiconductor circuit of claim 1, wherein conductive trace is contained within the first layer and extends vertically into the first magnetic material from an interface between the first layer and the second layer.

4. The semiconductor circuit of claim 2 wherein the conductive connection between the conductive pad and the outside substrate comprises a solder ball.

5. The semiconductor circuit of claim 2, wherein the conductive trace, the horizontal connection and the conductive pad are on the same layer.

6. The semiconductor circuit of claim 2, wherein the one layer comprises a first buildup (BU) layer and the conductive pad is formed on the first BU layer.

7. The semiconductor circuit of claim 6 wherein the first BU layer includes a first cavity and the first magnetic material is in the first cavity.

8. The semiconductor circuit of claim 7 further comprising a solder resist (SR) layer above the first BU layer.

9. The semiconductor circuit of claim 8 wherein the SR layer includes a second cavity and the second magnetic material is in the second cavity.

10. The semiconductor circuit of claim 8 wherein the second magnetic material is in contact with the first magnetic material.

11. The semiconductor circuit of claim 1, wherein the conductive connection partially overlaps the conductive trace, and the second magnetic material interfaces with the conductive connection, the conductive trace, and the first magnetic material.

12. The semiconductor circuit of claim 7, wherein a second BU layer is below the SR layer, the second BU layer comprising at least one trace.

* * * * *